United States Patent [19]

Craycraft

[11] 4,192,014
[45] Mar. 4, 1980

[54] ROM MEMORY CELL WITH $2^n$ FET CHANNEL WIDTHS

[75] Inventor: Donald G. Craycraft, Spring Valley, Ohio

[73] Assignee: NCR Corporation, Dayton, Ohio

[21] Appl. No.: 962,572

[22] Filed: Nov. 20, 1978

[51] Int. Cl.² .......................................... G11C 17/00
[52] U.S. Cl. ...................................... 365/104; 365/45
[58] Field of Search ............... 365/94, 103, 104, 45, 365/184, 185

[56] References Cited

U.S. PATENT DOCUMENTS

| | | | |
|---|---|---|---|
| 3,656,117 | 4/1972 | Maley et al. | 365/104 |
| 4,054,864 | 10/1977 | Audaire et al. | 365/184 |
| 4,085,459 | 4/1978 | Hirabayashi | 365/184 |

*Primary Examiner*—Stuart N. Hecker

*Attorney, Agent, or Firm*—J. T. Cavender; Philip A. Dalton

[57] ABSTRACT

An FET read-only memory cell capable of storing more than one bit per cell. The channel geometry of the FET cell is selected to provide an electrical output that is characteristic of a predetermined combination of bits. For example, the FET channel width can be selected to provide one of $2^n$ predetermined output voltage values which correspond to the $2^n$ possible arrangements of n bits. The read function utilizes $2^n - 1$ sense amplifiers, which are connected to the FET. Each sense amplifier is selectively activated at a separate one of $2^n - 1$ voltage levels which is intermediate two adjacent values of the $2^n$ output voltages. The collective outputs of the sense amplifiers drive a logic circuit for decoding the values of the n data bits represented by the FET channel width.

8 Claims, 10 Drawing Figures

THROUGH Y DECODE
TO SENSE AMPLIFIERS

ROM MEMORY CELL WITH $2^n$ FET CHANNEL WIDTHS

BACKGROUND OF THE INVENTION

The present invention relates generally to CIS (conductor-insulator-semiconductor) technology and to high-density read-only memories (ROMs).

The rapid implementation of improved process techniques and improved designs has recently provided a multitude of memory subsystems, including the ROM. The ROM may be considered a memory when used in microprogramming applications, or a logic function generator. The ROM subsystem may be thought of as comprising three subsystem functions (1) memory storage provided by an array of memory cells generally defined by the intersection of a matrix of rows and columns of FETs; (2) addressing buffers and decoders for selecting the stored information bits to obtain output signals from the addressed memory; and (3) an output buffer for amplifying the output signals. Conventional ROMs use the presence or absence of a FET to represent binary 1 or 0. That is, the memory cell FET locations are designed, or programmed during processing, to provide an output (FET present) or no output (FET absent) upon the application of an interrogation signal. The conductive/non-conductive, output/nonoutput condition represents bit values 1 and 0 (or vice versa). Conventional ROMs thus can store a maximum of one bit per cell.

To facilitate description of the ROMFETs, we shall not refer to the "presence" or "absence" of a FET, but shall consider every memory cell to contain a FET which either has an output or, for example, has no channel and, thus, no output.

FIG. 1 shows a section of a conventional ROM 10 which uses an m×n memory cell matrix. ROM 10 employs one bit per cell memory storage. The illustrated section contains FETs 11, 12, and 21, 22. FETs 12, 21 and 22 become conductive upon the application of a suitable gate voltage. FET 11 has no channel and is incapable of conducting current, at least under normal operating conditions.

Referring further to FIG. 1 and also to FIG. 2, FET 12 comprises a substrate 5 of one conductivity type in which spaced-apart surface-adjacent diffused regions of the opposite conductivity type form a source and a drain. Source 23 is one end of diffusion region 18 (FIG. 1), while drain 24 is a projecting region of diffusion stripe 19 (FIG. 1). (Unless specified otherwise, "diffused" and "diffusion" include doped regions formed by ion implantation techniques as well as by diffusion techniques.)

The gate structure of FET 12 comprises gate dielectric 26 (FIG. 2), typically silicon dioxide, and a polysilicon gate electrode, which is the section of polysilicon row line 15 (FIG. 1) extending between the source 23 and drain 24. Thick, field dielectric layer 27, typically silicon dioxide, electrically isolates the device 12 from other circuit components. Column line 14, which comprises conducting metal such as aluminum, contacts source 23 at 28 for applying control voltages as needed to the source 23 and to other FETs along the column line. Control voltages can be applied at one end of the drain diffusion stripe 19, and at a suitable point along substrate 5. Control voltages can be applied via polysilicon word line 15 to the gate of FET 12 and other FETs in the same row, such as FET 11. When interrogated by a gate signal which is greater than its threshold voltage, FET 12 becomes conductive, representing storage of binary "1".

Referring further to FIG. 1 and also to FIG. 3, FET 11 includes a gate electrode, which is formed by polysilicon word line 15. Metal column line 13 is effectively isolated from word line 15 by oxide layer 31 and crosses over word line 15 to contact diffusion region 17 at 32. However, in contrast to FET 12, FET 11 effectively has no source or drain. That is, the diffusion region 17 is spaced from the gate-forming word line 15 and thus is ineffective as a source. Nor is there a drain-forming region projecting from the diffusion stripe 19. Furthermore, the gate structure is surrounded by oxide layer 31 and is thereby electrically isolated from the channel. Either condition is sufficient to preclude conduction in the FET 11 under normal operating conditions. Thus, when interrogated by a gate signal which is greater than the threshold voltage of the conducting FET 12, FET 11 remains non-conductive, which is indicative of storage of binary "0".

The density of conventional ROM cells such as those of FIG. 1 is limited by the design limitations of current CISFET process techniques. To date, CISFET process technology is capable of providing n channel ROM cell densities of about 400,000 per square centimeter, excluding peripheral circuitry. For ROM cell designs using one bit per cell, comparable bit storage densities are available. With the limitation of ROM designs to one bit per cell, further increases in binary storage capability must come from improved process techniques, e.g., from increasingly precise and expensive techniques such as x-ray or electron beam lithography and ion implanted source and drain regions.

It is thus apparent that it is highly desirable to have ROM designs which provide storage densities greater than one bit per cell, without comparable increases in the physical size of the cell. Such an increase in memory storage density is available in CCD technology, where two bits per cell storage is provided by conventional CCD structures using analog storage techniques. However, to applicant's knowledge, there is no prior art CISFET memory which provide storage densities greater than one bit per cell.

SUMMARY OF THE INVENTION

It is an object of the present invention to provide a ROM design which has increased bit storage density utilizing current process technology.

It is another object of the present invention to provide a ROM having binary storage density greater than one bit per cell, and without significantly increasing the size of the cell.

The present invention relates to an FET read only memory cell which stores more than one bit per cell. The channel conductance of the FET is tailored to provide an electrical output which represents a particular set of bit values.

The inventive concept is applicable in general to an FET ROM cell for storing n bits of binary information per cell, where $n > 1$. The cross-section of the FET channel is tailored to control the conductance and thereby to provide one of $2^n$ possible analog electrical output values which represent the $2^n$ possible arrangements of n bits. To read the stored information from an FET cell, the output of the FET is applied to converting means which converts the analog electrical output to a binary digital number of n bits. The converting means can comprise $2^n-1$ sense amplifiers whose collective outputs drive a logic decoder to generate the bit combination associated with the channel size.

For exemplary two bit per cell storage, there are $2^n-1=3$ sense amplifiers which are selectively activated so that none, one, two or all three provide output signals in response to the four possible FET output signal levels. These four sense amplifier output combinations correspond to the possible arrangements of two bits: 00, 10, 01, 11.

DETAILED DESCRIPTION

Figure 1:
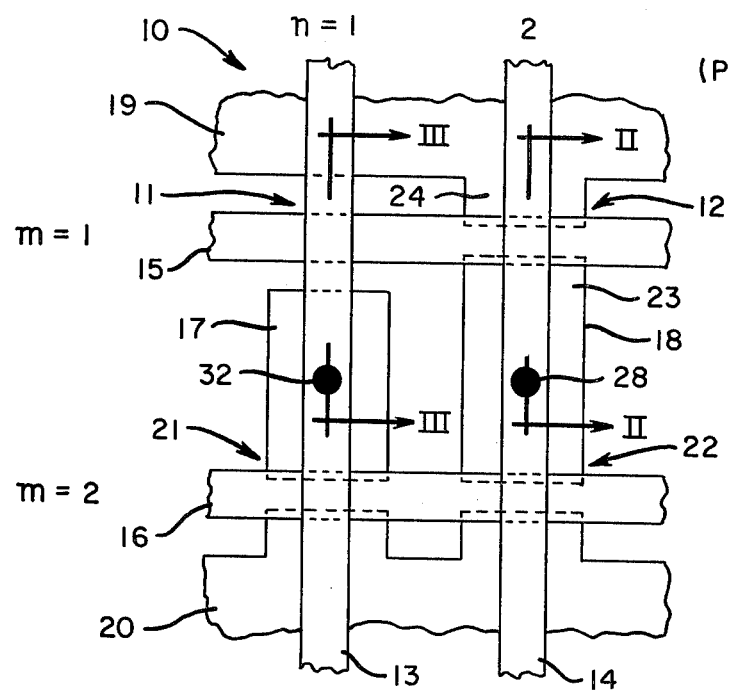
FIG. 1 is a schematic representation of the layered components of a conventional ROM which can store one bit per FET memory cell.
Figure 2:
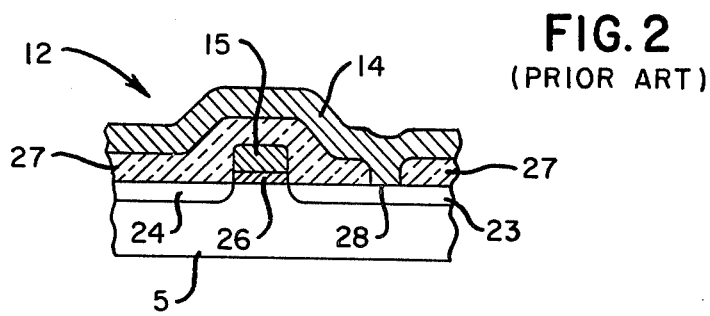
FIGS. 2 and 3 are cross-sectional views taken along lines 2—2 and 3—3 of FIG. 1.
Figure 3:
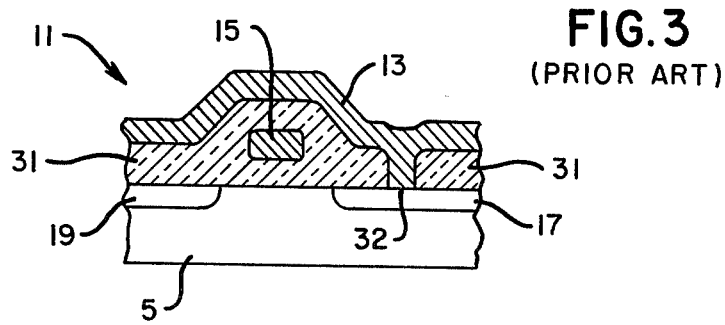

According to the present invention, the channel conductance of an FET read-only memory cell is selected to provide an electrical output which represents a plurality of bits of information. The channel cross-sectional area can be varied to select the channel conductance. Conveniently, the cross-sectional area is determined by the effective channel width, which in turn is determined by the width of the channel-defining source and drain diffusions. As examples of alternatives, channel length, a combination of channel length and width, or channel implantation levels could be employed to select the channel conductance.

Consider binary information storage as an example. There are $2^n$ different permutations or arrangements of bits taken n at a time. Tables I and II show the possible arrangements for $n=2$ and $n=3$. The channel width of the FET memory cell is conveniently set to one of $2^n$ predetermined widths with corresponding FET output values which represent the possible arrangements. As shown, an ordered sequence of these output values is chosen to arbitrarily represent the sequence of 1, 2 ... $2^n$ possible arrangements of bits taken n at a time. Note that the output values, not the physical channel dimensions per se, represent the binary sequence. Thus, rather than merely using, e.g., $w_1=0$; $w_2=\frac{1}{3}w_4$; $w_3=\frac{2}{3}w_4$ in Table I, the physical channel widths are those which provide an output sequence such as $V_1=0$; $V_2=\frac{1}{3}V_4$; $V_3=\frac{2}{3}V_4$; $V_4$.

In Table II, the physical channel widths are those necessary to provide outputs such as $V_1=0$; $V_2=1/7V_8$; $V_3=2/7V_8$, $V_4=3/7V_8$; $V_5=4/7V_8$; $V_6=5/7V_8$; $V_7=6/7V_8$; $V_8$. As described below, an array of $2^n-1$ sense amplifiers can be used to read the stored binary data from any number of such FET memory cells, limited only by the operational characteristics, such as the sensitivity of the sense amplifiers, and by the circuit design.

Table I

| Combination No. | Bits | | FET Channel Width | FET Output | Sense Amplifier Output | | |
|---|---|---|---|---|---|---|---|
| | $B_0$ | $B_1$ | | | 12 | 23 | 34 |
| 1 | 0 | 0 | $w_1$ | $V_1$ | 0 | 0 | 0 |
| 2 | 0 | 1 | $w_2$ | $V_2$ | 1 | 0 | 0 |
| 3 | 1 | 0 | $w_3$ | $V_3$ | 1 | 1 | 0 |
| 4($2^n$) | 1 | 1 | $w_4$ | $V_4$ | 1 | 1 | 1 |

Table II

| Combination No. | Bits | | | FET Channel Width | FET Output | Sense Amplifier Output | | | | | | |
|---|---|---|---|---|---|---|---|---|---|---|---|---|
| | $B_0$ | $B_1$ | $B_2$ | | | 12 | 23 | 34 | 45 | 56 | 67 | 78 |
| 1 | 0 | 0 | 0 | $w_1$ | $V_1$ | 0 | 0 | 0 | 0 | 0 | 0 | 0 |
| 2 | 1 | 0 | 0 | $w_2$ | $V_2$ | 1 | 0 | 0 | 0 | 0 | 0 | 0 |
| 3 | 0 | 1 | 0 | $w_3$ | $V_3$ | 1 | 1 | 0 | 0 | 0 | 0 | 0 |
| 4 | 1 | 1 | 0 | $w_4$ | $V_4$ | 1 | 1 | 1 | 0 | 0 | 0 | 0 |
| 5 | 0 | 0 | 1 | $w_5$ | $V_5$ | 1 | 1 | 1 | 1 | 0 | 0 | 0 |
| 6 | 1 | 0 | 1 | $w_6$ | $V_6$ | 1 | 1 | 1 | 1 | 1 | 0 | 0 |
| 7 | 0 | 1 | 1 | $w_7$ | $V_7$ | 1 | 1 | 1 | 1 | 1 | 1 | 0 |
| 8($2^n$) | 1 | 1 | 1 | $w_8$ | $V_8$ | 1 | 1 | 1 | 1 | 1 | 1 | 1 |

Figure 4:
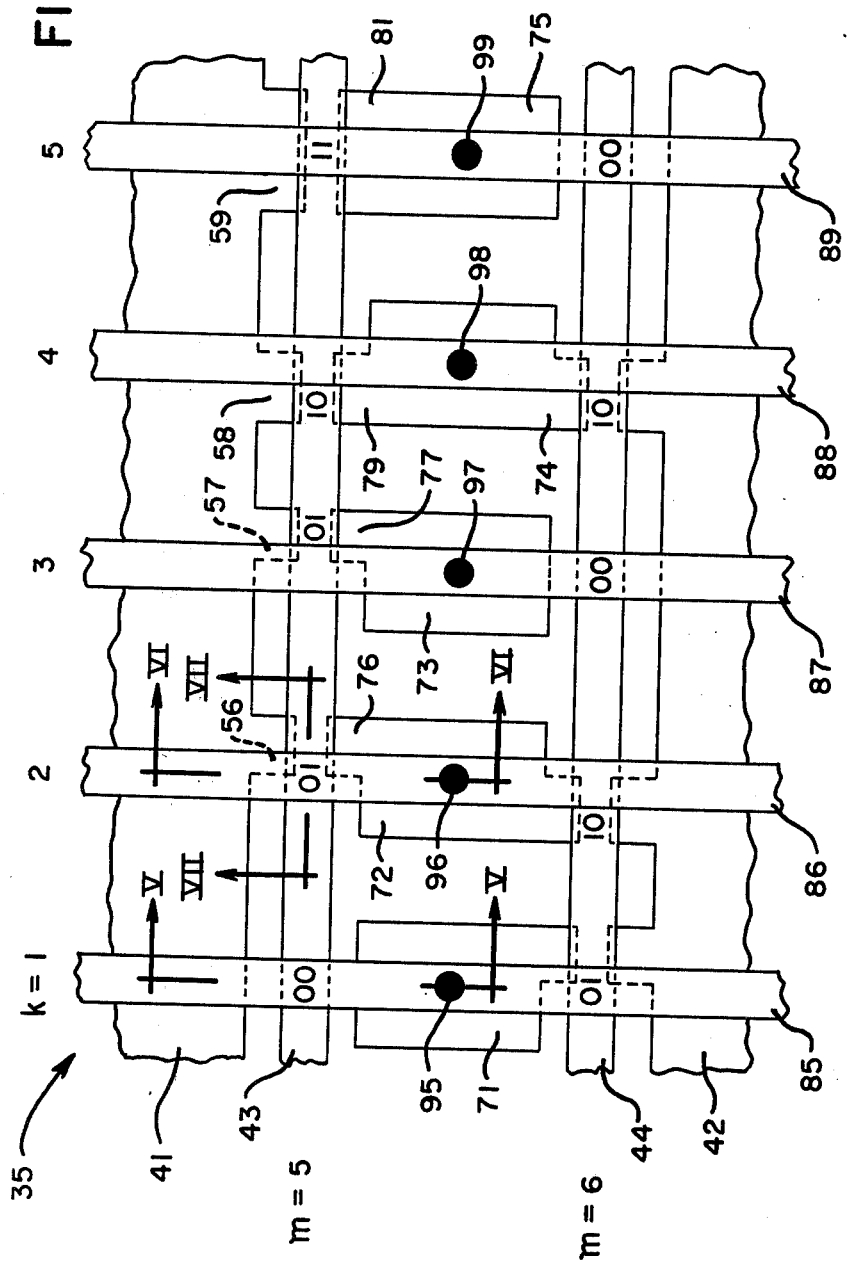
FIG. 4 is a schematic representation of the layered components of a ROM memory which stores two bits of information per cell.

FIG. 4 is a schematic plan view of a portion of a ROM 35 which contains an m×k, row by column matrix of FET cells. The cells of the matrix are designated 51–55 and 61–65, where the first number of each numerical designation is the row and the second is the column. The figure identifies the stored binary information for each cell location.

The cell design of ROM 35 is conventional, except for the varied widths of the diffusions which define the FET sources and drains. Because the channel conductance and the resulting channel current or voltage output are determined by the effective channel width provided by these diffusions, the binary state of each FET can be determined from the magnitude of the channel current or voltage. Thus, FET 51, which does not have a source-forming diffusion or a drain-forming diffusion, has no channel and represents binary 00. For FETs 52–55, projections 56–59 from diffusion stripe 41 form the drains, and the sources are formed by the upper ends 76, 77, 79, 81 of diffusion areas 72–75. The widths $w_2$; $w_2$; $w_3$; and $w_4$ of the channel-defining diffusions 56 and 76; 57 and 77; 58 and 79; and 59 and 81 are tailored as described previously so that the outputs of FETs 52–55 represent binary 01; 01; 10; and 11 in accordance with Table I. Although row 6 will not be described in detail, the channel widths provided by drain-forming ends of diffusions 71-75 and source-forming projections of diffusion stripe 42 provide binary 01, 10, 00, 10, and 00 for FETs 61-65, respectively, in accordance with Table I.

Control voltages can be applied to the drains of cell row 5 via electrical contact (not shown) which can be made at one end of the diffusion stripe 41. Control voltages can be applied to the source diffusions via metal column lines 85-89. Polysilicon line 43 forms the gate electrode for each of the transistors in row 5. Electrical contact is made at one end of this polysilicon line for providing control signals to the gates. Other electrical connections, such as to the ROM circuit substrate (not shown) of course can be provided as necessary. The gate voltage controls the conductive state of the channel between the source and drain, i.e., turns the FET on or off, while voltages can be applied to the source, drain, and substrate to control, e.g., the threshold voltage and the magnitude of the drain-to-source current.

Figure 5:
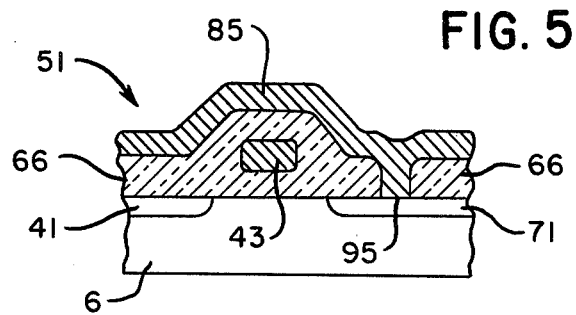
FIGS. 5 and 6 are cross-sectional views taken alone lines 5—5 and 6—6 of FIG. 4, showing the varied channel geometry which provides the electrical outputs characteristic of the possible combinations of two bits.
Figure 6:
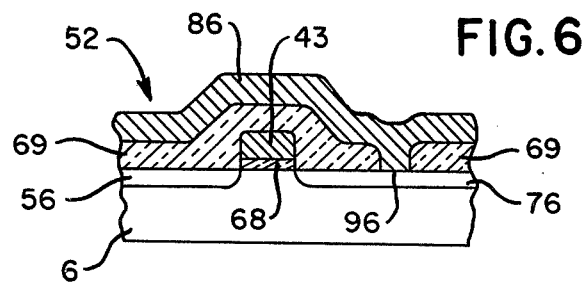
Figure 7:
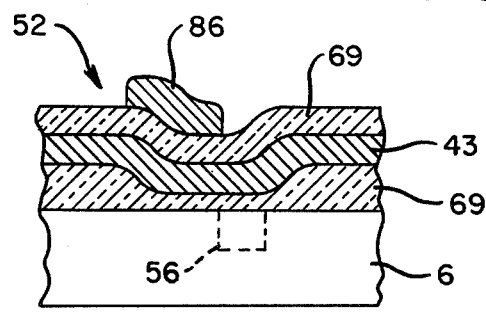
FIG. 7 is a cross-sectional view taken along line 7—7 of FIG. 4 parallel to the channel width.

The construction of the FETs of FIG. 4 is further clarified in FIGS. 5-7. FIG. 5 is a cross-sectional view of FET 51, which has no channel. FIG. 6 is a cross-sectional view of transistor 52, and also is representative of all the row 5 FETs 52-55, which have an effective channel width greater than 0 (i.e. $w_2$, $w_3$ or $w_4$). FIG. 7 is a cross-sectional view of FET 52 taken within the channel looking perpendicular to the channel width. It should be noted that the memory array of FIG. 4 is constructed using conventional, well-known process techniques. The method of construction does not form a part of this invention and will not be explained here.

Referring further to FIG. 5, the absence of source and drain-defining projections associated with the diffusions 41 and 71 in substrate 6 precludes the formation of a channel beneath the section of the polysilicon gate stripe 43 associated with FET 51. Also, the gate electrode 43 is surrounded by thick silicon oxide layer 66, which precludes the formation of a channel under normal operating conditions.

Referring now to FIGS. 6 and 7, FET 52 comprises source 56 and drain 76 which extend from the diffused regions 41 and 72, respectively. A gate dielectric layer 68, typically of silicon dioxide, extends over the channel region between the source and drain and has the polysilicon gate electrode 43 formed thereon. A thick silicon oxide layer 69 isolates the gate electrode 43 from the metal column line 86, which contacts the source-forming diffused region 72 at 82.

Figure 8:
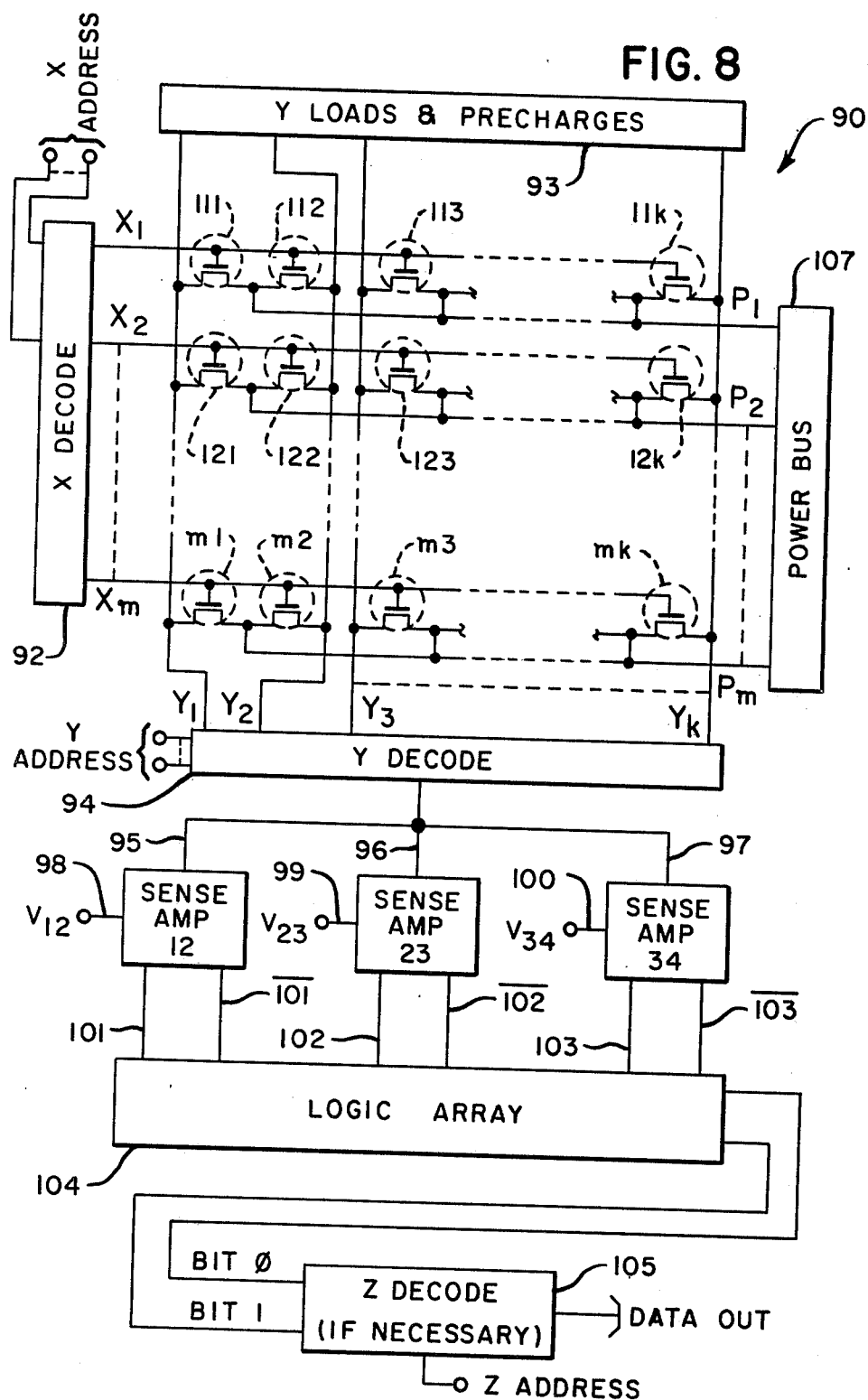
FIG. 8 is a block diagram of a ROM array which utilizes FET memory cells emboding the principles of the present invention.

FIG. 8 is a block diagram of the organization of an m×k ROM array 90 which utilizes the ROM cell design of FIG. 4. The rectangular array 90 stores two bits (n=2) per memory cell location. This is done using one of four FET channel widths ($2^n=4$) in each memory cell location and sensing the FET output voltage using three ($2^n-1=3$) differential sense amplifiers. The FET memory cells are designated 111, 112, 113, ... mk. The X lines correspond to polysilicon gate electrode lines such as line 43 of FIG. 4. The P and Y lines correspond respectively, to metal contact lines for the source, such as 85-89, and to drain diffusion stripes, such as 41 and 42, all of FIG. 4.

Figure 9:
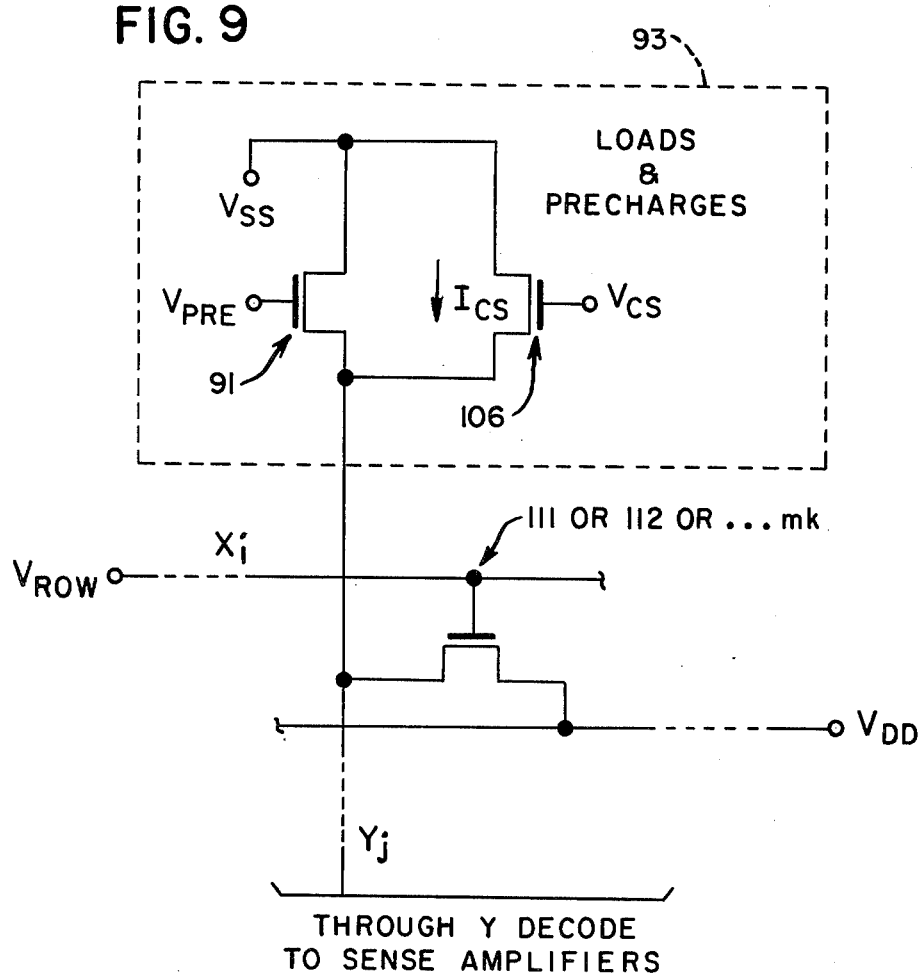
FIG. 9 is a partial, schematic representation of FIG. 8 showing the arrangement for applying read voltages to a single FET memory cell.

The array 90 is prepared for reading the stored binary digital values by first precharging all the Y lines and sense amplifiers. Current source FET 106 can be on at all times. Referring to FIGS. 8 and 9, voltage $V_{pre}$ is driven high to turn on FET 91 and precharge the individual $Y_j$ lines (j=1,2,...k) to $V_{ss}$. Then, $V_{pre}$ goes low to turn off FET 91 and X decode 92 selects a row line $X_i$ (i=1,...m) and drives the selected row line to a "1". That is, $V_{row}$ is applied to the selected row $X_i$ so that all the transistors therein are turned on (unless they are binary 00) and drive into the Y loads 93. The transistors generate an output voltage on each Yj line which is determined by the threshold voltage at $I_{cs}$ of each memory FET. Stated differently, the output voltage is determined by the voltage division between the memory FET and current ($I_{cs}$) source device 106. Each output voltage is one of the four possible output voltages $V_1$-$V_4$ shown in Table I.

Figure 10:
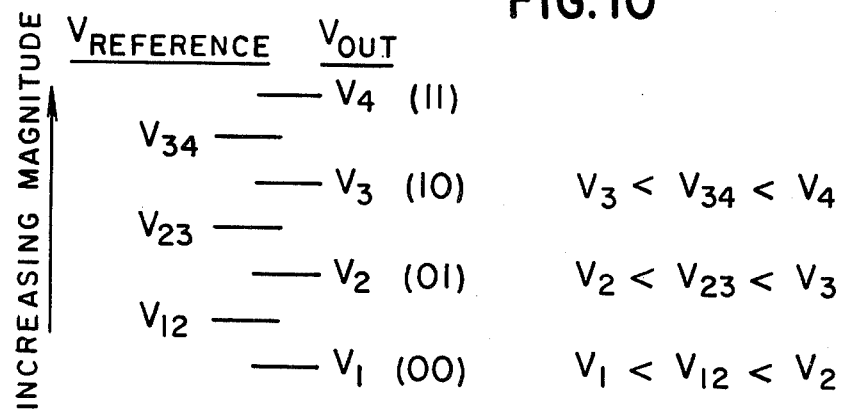
FIG. 10 is a chart showing the relative magnitudes of the reference voltages and FET output voltages for the arrangements of Table I and FIGS. 8 and 9.

To decode the output, a $Y_j$ line is selected by the Y decode 94 and drives through the Y decode 94 and into a first input terminal 95, 96, 97 of each sense amplifier. The differential sense amplifiers compare the output voltage against three reference voltages $V_{12}$, $V_{23}$, and $V_{34}$, which are applied, respectively, to a second input terminal 98, 99, 100 of each sense amplifier. The reference voltages are between and, typically, are an average of the three pairs of adjacent FET output voltages. (For example, $V_{12}=(V_1+V_2)/2$.) A sense amplifier provides an output signal if the voltage at the first input terminal exceeds the reference voltage. Referring to FIGS. 8 and 10, the memory cell output voltage $V_1$, $V_2$, $V_3$, or $V_4$ thus turns on none of the sense amplifiers ($V_1$), sense amplifier SA12 ($V_2$), two sense amplifiers SA12 and SA23 ($V_3$), or all three sense amplifiers SA12, SA23 and SA34 ($V_4$). The outputs at terminal pairs 101 and $\overline{101}$; 102 and $\overline{102}$; 103 and $\overline{103}$ of the three sense amplifiers are the inverse of one another and are provided as inputs to a logic array 104. The collective sense amplifier outputs control the operation of logic circuit 104, which generates the two bits of data associated with the particular channel width of the selected FET. See Table I. (The on and off states of the sense amplifiers are indicated respectively by "1" and "0" in the tables.) These two bits of data can be used as parallel outputs or can be applied to a Z decode 105 which would then output a selected one of the data bits depending upon the value of the Z control signal.

The sense amplifiers, logic array and X, Y and Z decodes are of conventional design and need not be described in detail.

As an example of decoding a particular FET memory cell output, refer to FIG. 8 and assume that the channel width of FET 111 in array 90 is $w_3$. That is, the width of the channel of FET 111 is selected to provide an output $V_3=\frac{3}{4}V_4$, which corresponds to bit combination 10, Table I. Upon application of $V_{row}$ to row $X_1$ as described above, this output $V_3$ is generated on line $Y_1$ and is applied via Y decode 94 to one of the input terminals 95, 96, 97 of each sense amplifier. Referring further to FIG. 8 and also to FIG. 10, $V_3$ is greater than the reference voltages $V_{12}$ and $V_{23}$ which are applied to sense amplifiers SA12 and SA23, respectively, but smaller than the reference voltage $V_{34}$ applied to sense amplifier SA34. Accordingly, SA12 and SA23, but not SA34, are turned on by $V_3$ and their collective outputs drive logic array 104 to generate the two bits 10.

As another example, if the channel width of FET 111 had been $w_2$ ($w_2$ is tailored to provide output $V_2=\frac{1}{4}V_4$), only sense amplifier SA12 would be turned on by the output, and this single output would drive logic array 104 to generate the bits 01 associated with output $V_2$.

An NCR standard PDISG (p-channel dielectrically insulated silicon gate) ROM cell utilizes a cell size of 15 microns × 23 microns (345 square microns) and provides a storage density of about 290,000 bits per square centimeter, excluding control circuitry. For this standard cell size, a two bit per cell, PDISG ROM array 90 provides storage of about 580,000 bits per square centimeter, excluding control circuitry. A maximum physical channel width $w_4 = 7.5$ microns is used. This dimension is an example only, for greater or lesser widths are available at the option of the circuit designer.

Thus, there has been described an FET read only memory cell capable of storing more than one bit per cell, alternative arrangements for storing various numbers of binary bits, and an example of a memory array which utilizes the memory cell concept. It will be appreciated that other memory arrays will be readily devised by those skilled in the art.

What is claimed is:

1. In a read-only memory wherein information storage is provided by a field-effect transistor, the improvement comprising: the transistor channel having a conductance value selected from $2^n$ possible values $(n>1)$ to provide a predetermined electrical output which is characteristic of a particular set of n binary digit values, and means for decoding said electrical output into said set of n binary digit values.

2. The improved read-only memory of claim 1, wherein the channel width is selected to provide the predetermined electrical output.

3. The improved read-only memory of claim 1 or 2 wherein the electrical output is characteristic of one of the possible arrangements of n bits of information, n being greater than 1.

4. The improved memory cell of claim 3, wherein the electrical output is voltage and the width of the channel is selected to provide an output voltage which is characteristic of said set of n binary digit values.

5. In a read-only memory comprising a plurality of cells wherein information storage is provided in individual cells by a field-effect transistor, the improvement wherein a cell represents one set of a plurality of sets of n bits of information, $n \geq 2$, the one set being selected from the $2^n$ arrangement of bits taken n at a time, comprising:

the cross-sectional area of the transistor channel being selected from one of $2^n$ preselected values to provide an electrical output corresponding to said one set of n bits;

the $2^n$ transistor electrical outputs forming an ordered sequence;

sensing means connected to the plurality of cells and selectively activated in response to the transistor electrical outputs for producing an amplified electrical output characteristic of the one field effect transistor output of the ordered sequence; and logic means driven by the sensing means output for generating said set of n bits corresponding to the transistor output.

6. The read-only memory of claim 5 wherein the electrical output is voltage and wherein the sensing means comprises $2^n - 1$ sense amplifiers, each having first and second input terminals and an output terminal; the first input terminal of each sense amplifier being maintained at one of a series of reference voltages intermediate the magnitude of the transistor output voltages; and the output voltage of the transistor being applied to the second input terminal for activating the sense amplifier to provide an output voltage when the second input terminal voltage exceeds the first input terminal voltage.

7. A read-only memory, comprising:

a matrix of memory cells, information storage being provided in individual cells thereof by a field-effect transistor, and each cell representing one set of a plurality of sets of n binary digit values, $n \geq 2$, said one set of binary digit values being selected from $2^n$ arrangements of bits taken n at a time; and further comprising:

the cross-sectional area of the transistor channel being selected from one of $2^n$ preselected values to provide an electrical output representing said one set of n binary digit values;

the $2^n$ transistor electrical outputs forming an ordered sequence;

sensing means comprising $2^n - 1$ sense amplifiers, each sense amplifier having first and second input terminals and an output terminal; the first input terminal of each sense amplifier being maintained at one of a series of reference voltages related to the magnitude of the transistor electrical outputs; and the electrical output of the transistor being applied to the second input terminal for activating the sense amplifier when the second input terminal voltage exceeds the first input terminal voltage to provide a sense amplifier output voltage; and logic means driven by the collective output of the sense amplifiers for generating said set of n binary digit values corresponding to the transistor output.

8. The read-only memory of claim 7, wherein the transistor electrical output is selected from voltage and current.

* * * * *